(12) United States Patent
Doi

(10) Patent No.: US 6,946,939 B2
(45) Date of Patent: Sep. 20, 2005

(54) PACKAGING PLATE FOR MAGNETIC CIRCUIT, METHOD FOR PACKAGING MAGNETIC CIRCUIT USING THE SAME, AND MAGNETIC CIRCUIT PACKAGE

(75) Inventor: Yuhito Doi, Takefu (JP)

(73) Assignee: Shin-Etsu Chemical Co., Ltd., Tokyo ( * ) Notice: Subject to any disclaimer, the term of this patent is extended or adjusted under 35 U.S.C. 154(b) by 0 days.

(21) Appl. No.: 10/937,980

(22) Filed: Sep. 10, 2004

(65) Prior Publication Data

US 2005/0052266 A1 Mar. 10, 2005

(30) Foreign Application Priority Data

Sep. 10, 2003 (JP) ........................................ 2003-317901

(51) Int. Cl.[7] .............................. G01V 3/00; H01F 7/00
(52) U.S. Cl. ...................... 335/296; 335/301; 335/304; 324/318; 174/32; 174/35 MS
(58) Field of Search ................. 335/296–306; 174/32–35 TS; 324/318–320

(56) References Cited

U.S. PATENT DOCUMENTS 5,108,833 A * 4/1992 Noguchi et al. ......... 428/310.5
6,225,556 B1 * 5/2001 Saito ........................... 174/36
6,313,632 B1 11/2001 Aoki et al.

FOREIGN PATENT DOCUMENTS

JP 2965968 8/1999

* cited by examiner

*Primary Examiner*—Ramon M. Barrera
(74) *Attorney, Agent, or Firm*—Alston & Bird, LLP

(57) ABSTRACT

It is an object to provide a package for a magnetic circuit, with which a leakage magnetic field escaping from an aperture of a magnetic circuit is reduced and the magnetic attraction acting on the packaging plates is lowered, thus reducing the number of packaging work steps. There are provided a packaging plate for a permanent magnet-type magnetic circuit, the packaging plate comprising at least one non-magnetic layer and at least one magnetic layer; and a method for packaging a permanent magnet-type magnetic circuit, comprising a step of shielding at least a portion of an aperture of a permanent magnet-type magnetic circuit using at least one packaging plates.

7 Claims, 2 Drawing Sheets

POINT OF MEASUREMENT OF LEAKAGE MAGNETIC FIELD

PACKAGING PLATE FOR MAGNETIC CIRCUIT, METHOD FOR PACKAGING MAGNETIC CIRCUIT USING THE SAME, AND MAGNETIC CIRCUIT PACKAGE

BACKGROUND OF THE INVENTION

1. Field of the Invention

The present invention relates to a packaging plate (as used herein, the term "plate" shall include a "sheet") for a magnetic circuit and a method for packaging a magnetic circuit using the same. More specifically, the present invention relates to the packaging of a permanent magnet-type magnetic circuit for a magnetic resonance imaging (MRI) system during its transportation and storage.

2. Description of Related Art

Magnet-type magnetic circuits comprising rare earth magnets has been mainly used for magnetic circuits comprising permanent magnets for magnetic resonance imaging systems. Such magnet-type magnetic circuits comprise magnets, yokes through which the magnetic flux from the magnets passes, and pole pieces that are ordinarily arranged on the magnet surface and made of a soft magnetic substance such as soft iron to generate a homogenous magnetic field in the gap between the magnets.

Referring to FIGS. 3 and 4, the following is an explanation of a conventional permanent magnet-type magnetic circuit. FIG. 3 is a schematic cross-sectional view of a permanent magnet-type magnetic circuit 101, taken from the front. FIG. 4 is a schematic cross-sectional view of the permanent magnet-type magnetic circuit 101, taken from the side. In FIGS. 3 and 4, the permanent magnet-type magnetic circuit 101 comprises a pair of permanent magnets 105, 106 which oppose each other across a gap and are magnetized in the direction of their thickness; yokes 102 to 104 which are arranged outside the gap between the permanent magnets, and which support the permanent magnets; and a pair of pole pieces 107, 108 each arranged on a gap side of the an opposing surface of each of the permanent magnets and having a peripheral projection in opposing orientation so that a magnetic field can be generated between the two pole pieces.

In such a magnet-type magnetic circuit, the yoke comprises upper and lower base plates (plate-shaped yokes) for having magnetic poles and one or two columns (column yoke) connecting these base plates, and the entire area except for the column can be regarded as the aperture portion. Such a magnet-type magnetic circuit has the advantage that its aperture is considerably wider than that of a superconductive solenoid coil-type magnetic circuit, and thus a patient will feel less occluded during his medical examination. On the other hand, it has the disadvantage that magnetic substances may easily penetrate into it from the outside. In general, rooms in which MRT units are installed are control areas and there are safeguards in place against the bringing of magnetic substances into such rooms. However, during transportation of the unit from factory to hospital, in the course of dislocation inside hospital or during a temporary storage etc., magnetic substances can be attracted to the magnetic circuit in unforeseeable ways, because the permanent magnet-type circuit always generates a magnetic field. Thus, there is the risk that both equipment and people may be endangered by magnetic substances sucked into the magnetic circuit. When the magnetic circuit is transported by a truck or the like, it has to be first placed in an iron container to reduce the leakage magnetic fields leaking out of the magnetic circuit, thus requiring troublesome handling.

The above-mentioned problem is caused by a leakage magnetic field escaping from the aperture of the magnetic circuit. For this reason, this problem can be lessened by packaging the magnetic circuit so as to reduce the magnetic field leaking from the aperture. It is effective to shield the magnetic circuit with a magnetic substance in order to reduce the leakage magnetic field. However, if a magnetic plate is brought too close to the aperture of the magnetic circuit, an attracting force will be generated due to permanent magnets installed in the magnetic circuit, so that the attaching of the magnetic plate becomes dangerous, and also its dismantling becomes difficult. For this reason, non-magnetic plates have been usually used for packaging magnetic circuits (see Japanese Patent No. 2965968 B). But because this alone cannot sufficiently reduce the leakage magnetic field, troublesome transport using an iron container has been required.

SUMMARY OF THE INVENTION

It is thus an object of the present invention to provide a package for a magnetic circuit, with which a leakage magnetic field escaping from an aperture of a magnetic circuit is reduced and the magnetic attraction acting on the packaging plates is lowered, thus reducing the number of packaging work steps.

The present invention provides a packaging plate for a magnetic circuit, a method for packaging a magnetic circuit using the packaging plate and a magnetic circuit package to solve the above problem, reduce the leakage magnetic field escaping from the aperture of the magnetic circuit, and lower the magnetic attraction acting on the packaging plate.

According to one aspect of the present invention, there is provided a packaging plate for a permanent magnet-type magnetic circuit, the packaging plate comprising at least one non-magnetic layer and at least one magnetic layer. According to another aspect of the present invention, there is provided a method for packaging a permanent magnet-type magnetic circuit, comprising a step of shielding at least a portion of an aperture of a permanent magnet-type magnetic circuit using at least one packaging plate. Moreover, according to still another aspect of the present invention, there is provided a permanent magnet-type magnetic circuit package comprising: a permanent magnet-type magnetic circuit comprising: a pair of permanent magnets opposing each other across a gap, the pair of permanent magnets being magnetized in thickness direction; a yoke arranged outside of the gap between the permanent magnets, the yoke supporting the permanent magnets; and a pair of pole pieces each arranged on a gap side of an opposing surface of each of the permanent magnets and having a peripheral projection in opposing direction; wherein the permanent magnet-type magnetic circuit can generate a magnetic field between the pole pieces; and at least one above-described packaging plate, fixed to the magnetic circuit so as to shield at least a portion of an aperture of the magnetic circuit.

As will be explained in detail below, with the present invention, it is possible, in a package for a magnetic circuit, to reduce the leakage magnetic field escaping from the aperture portion of the magnetic circuit and to lower a magnetic attraction acting on packaging plates, thus obviating the need to place the magnetic circuit in an iron container, so that the number of packaging steps required can be reduced.

DETAILED DESCRIPTION OF PREFERRED EMBODIMENTS

Figure 1:
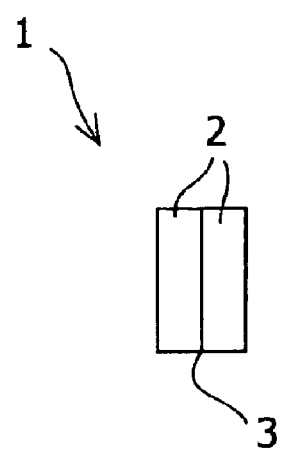
FIG. 1 is a schematic cross-sectional view of a packaging plate of the present invention.
Figure 2:
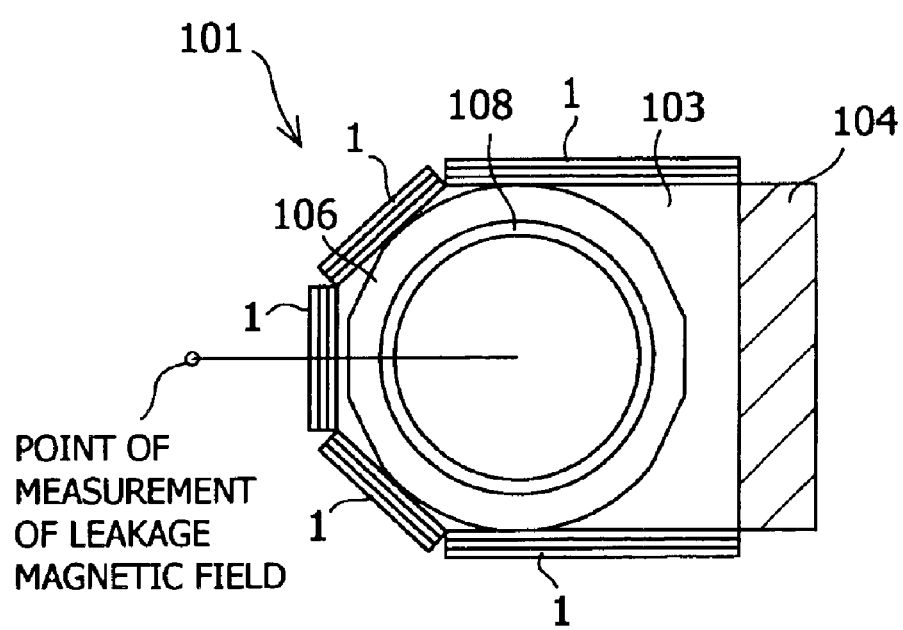
FIG. 2 is a schematic view of a lower permanent magnet and other parts, taken from above, when the permanent magnet-type magnetic circuit is packaged with packaging plates according to the present invention.
Figure 3:
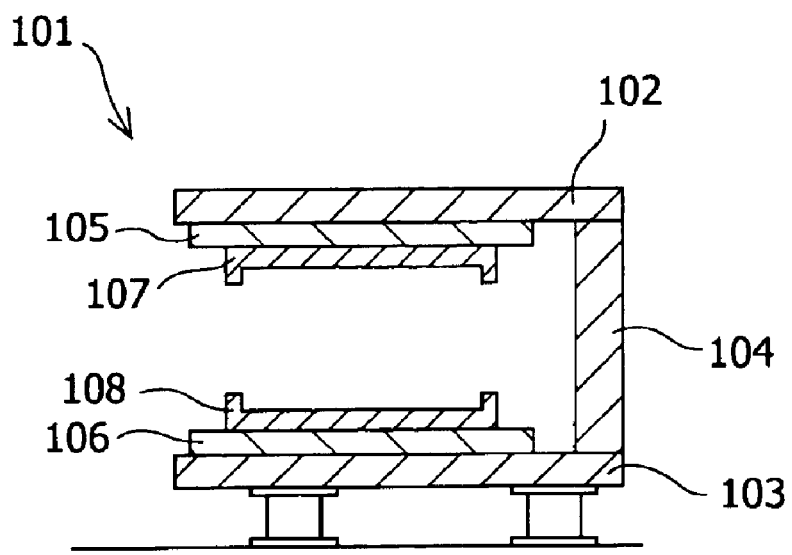
FIG. 3 is a schematic cross-sectional view of a permanent magnet-type magnetic circuit 101, taken from the front.
Figure 4:
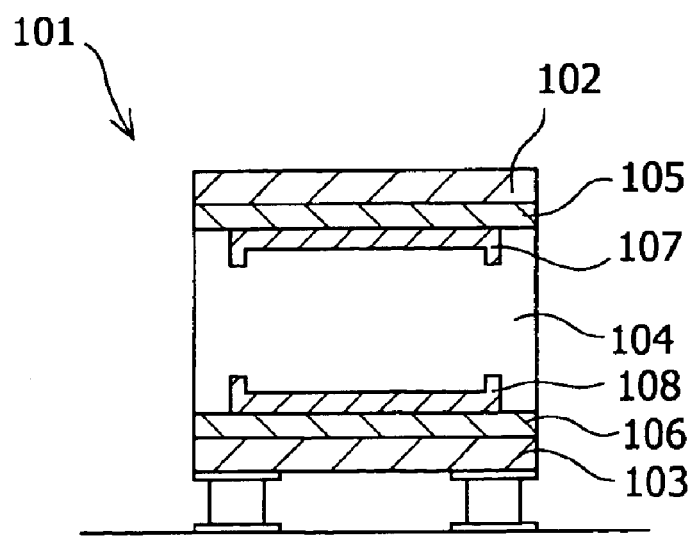
FIG. 4 is a schematic cross-sectional view of the permanent magnet-type magnetic circuit 101, taken from the side.

Referring to the accompanying drawings, the following is an explanation of an embodiment of the present invention. However, the scope of the present invention is by no means limited to this embodiment. FIG. 1 is a schematic cross-sectional view of a packaging plate of the present invention. FIG. 2 is a schematic view of a lower permanent magnet and other parts, taken from above, when the permanent magnet-type magnetic circuit is packaged with packaging plates according to the present invention.

The packaging plate of the present invention can be applied to permanent magnet-type magnetic circuits known in the art. Even though there is no particular limitation, as described above, in the permanent magnet-type magnetic circuit, substantially parallel plate yokes 102 and 103 may be supported by a columnar yoke 104. Substantially disk-shaped permanent magnets 105 and 106, preferably selected from the group consisting of Nd—Fe—B, Sm—Co and Sm—N—Fe, may be arranged in opposition on the two plate yokes 102 and 103. Moreover, pole pieces 107 and 108 whose base is preferably substantially disk-shaped may be attached to the opposing surfaces of the permanent magnets 105 and 106. The permanent magnets 105 and 106 may be both magnetized in their thickness direction, and substantially in the same direction.

On the other hand, at the periphery of the pole pieces 107 and 108 (i.e. at the periphery of the base), peripheral projections may be provided in opposing directions. Each projection may be provided to equalize the intensity of the magnetic field that is formed near the middle of the space between the pole pieces 107 and 108, and the height of the projections is preferably substantially constant. A soft magnetic layer can be used for the pole pieces 107 and 108 and it can be fabricated by layering peripheral projections of a soft magnetic material onto a base of a soft iron such as low carbon steel, or a yoke or the like. The present invention is especially effective when the magnetic field intensity to be generated at the middle of the magnetic circuit is preferably 1 T or less.

The packaging plate of the present invention comprises at least one non-magnetic layer and at least one magnetic layer and can reduce a leakage magnetic field escaping from the aperture of the magnetic circuit by shielding the aperture, which is the gap in the magnetic circuit. As shown in FIG. 1, it is preferable to configure the packaging plate of the present invention such that a magnetic layer 3 is sandwiched by non-magnetic layers 2, arranging the non-magnetic layers outside, that is, to devise a three-layer structure of non-magnetic/magnetic/non-magnetic layers. A two-layer structure of non-magnetic layer and magnetic layer is also possible, but in that case it is preferable that the non-magnetic layer is arranged on the magnetic circuit side, because more force is required for dismantling the packaging plate if the magnetic layer is arranged on the magnetic circuit side. On the other hand, in the case of the three-layer structure of a magnetic layer sandwiched by non-magnetic layers, the orientation does not need to be taken into consideration. It is also possible to configure the packaging plate as a structure comprising five or more layers or the like with non-magnetic layers arranged on the outside, but the working efficiency will then decline, because each sheet has to be layered one by one in fabricating the packaging plate. Therefore, it is preferable to devise the packaging plate with three layers, adjusting the thickness of each of the magnetic and non-magnetic layers. The magnetic and non-magnetic layers can be fixed by any method, and they may be fixed for example by adhesives, nails or the like, although there is no particular limitation. In the packaging plate of the present invention, the magnetic and non-magnetic layers do not necessarily have to be fixed beforehand, and the packaging plate may be completed by fixing the non-magnetic and magnetic layers onto the magnetic circuit respectively when it is packaged. A flexible sheet-shaped packaging plate can be used as the packaging plate of the present invention. For example, the object of the present invention can be achieved by encompassing the aperture of the magnetic circuit using a flexible sheet-shaped packaging plate having the above-mentioned three-layer structure.

The structure of the packaging plate can be suitably optimized in accordance with the magnetic field intensity of the magnetic circuit. Even though there is no particular limitation, it is preferable that the total thickness of the non-magnetic layers per packaging plate is 5 mm or more, and the total thickness of the magnetic layers per packaging plate is 1 mm or less, as will be described in more detail below. It is even more preferable that the total thickness of the non-magnetic layers per packaging plate is at least 10 mm and at most 20 mm, and the total thickness of the magnetic layers per packaging plate is at least 0.1 mm and at most 0.5 mm. If the thickness of the non-magnetic layer is less then that, the attraction toward the magnetic layer may become so strong that dismantling may become harder. On the other hand, packaging and unpacking works may be also disturbed due to increased attraction of the magnetic field if the thickness of the magnetic layer is larger than noted above.

Although there is no particular limitation, the non-magnetic layer can be of such material as wood, for example plywood, or plastics such as polyvinyl chloride, acrylic, polycarbonate, polystyrene etc., aluminum, SUS 300 austenitic stainless steel such as SUS 316 in Japanese Industrial Standard etc. Furthermore, even though there is no particular limitation, the magnetic layer is preferably of material having a high magnetic permeability, preferably having a maximum magnetic permeability of at least 1000 H/m ($m \cdot kg \cdot s^{-2} \cdot A^{-2}$), such as soft iron, silicon steel plate, permalloy, SUS 400 ferritic or martensitic stainless steel or the like. It is preferable that the saturation magnetic flux density is at least 1T (tesla: $kg \cdot s^{-2} \cdot A^{-1}$).

According to the present invention, it is possible to reduce the leakage magnetic field by shielding at least a portion or preferably the entire aperture in the permanent magnet-type magnetic circuit, using at least one packaging plate. Moreover, it is also possible to reduce the leakage magnetic field more effectively by installing several packaging plates layered onto the magnetic circuit. Although there is no particular limitation, when the magnetic circuit is packaged by installing the packaging plates on the lateral side of the magnetic circuit, which forms the aperture, by fixing the packaging plates to the yoke with bolts or the like so that the aperture of the magnetic circuit is covered, it is possible to remove the packaging plates one by one. It is thus possible to minimize the magnetic attraction acting on the packaging plate during packing and unpacking by packaging the magnetic circuit with a plurality of packaging plates so as to enable removing the plurality of packaging plates one by one.

When using a plurality of packaging plates, the number of packaging plates should be suitably optimized in accordance with a magnetic force of the permanent magnets and the magnitude of leakage magnetic field to be attained or the like.

Although there is no particular limitation, the following is an example of a method for fixing the packaging plate onto the magnetic circuit: First, long temporary bolts are provisionally fastened to the yoke at about four spots, and then a packaging plate having holes whose diameters are bigger than the heads of the bolts is hung on the bolts. After the required number of packaging plates has been hung up, the temporary bolts are replaced one by one by bolts having a length sufficient for fastening several packaging plates layered. It is possible to fix a plurality of packaging plates with a bolt by using washers having a diameter bigger than the holes of the packaging plate.

According to the present invention, it is possible to package the magnetic circuit in a compact size, with the leakage magnetic field reduced during transportation and storage. Therefore, it is not necessary to provide an extra iron container or the like. Moreover, the leakage magnetic field is so weak in this case that accidents due to magnetic substances attracted into the magnetic circuit can be avoided.

As explained above, it is preferable that the packaging covers the entire aperture, that is, to install the packaging plates over the entire lateral side of the aperture, so that the periphery of the pole pieces including the image pickup space is totally shielded against the outside. In addition to this, it is also preferable that the packaging plates are directly fitted onto the yoke. With this arrangement, the volume of the package including the magnetic circuit and packaging plates can be minimized.

EXAMPLE

A working example of the present invention is explained in contrast to a comparative example. However, the scope of the present invention is by no means limited to this example. In the working example, a C-shaped magnetic circuit with a central magnetic field intensity of 0.2 T was used to measure the leakage magnetic field with the gauss meter (FWBELL No.9900) at a point 1 meter away from its center toward the aperture side (see FIG. 2). A packaging plate was fabricated such that a soft iron sheet of 0.3 mm thickness was sandwiched with two sheets of plywood of 10 mm thickness so as to obtain a three-layer structure of non-magnetic/magnetic/non-magnetic layers. As shown in Table 1, a plurality of packaging plates was fitted to the aperture with bolts. FIG. 2 shows the state in which three packaging plates were layered, that is, three magnetic layers and six non-magnetic layers in total.

TABLE 1

| Number of packaging plates | Leakage magnetic field (mT) |
| --- | --- |
| 0 | 14 |
| 3 | 8 |
| 6 | 4 |
| 9 | 0.8 |

As becomes clear from Table 1, with the present invention, the magnetic circuit can be packaged in a safe state in which the leakage magnetic field of the magnetic circuit is minimized. Although plywood is used for the non-magnetic parts in the above working example, a reduction of the weight can be achieved by using styrene foam for the non-magnetic parts, except for a frame to be made of wood. On the other hand, when only one sheet of plywood of 10 mm thickness was used in a comparative example in place of the packaging plate in the working example, the leakage magnetic field reached a value of 14 mT, which is the same as in the case that no packaging plates are installed, which means that no reduction in the leakage magnetic field was attained. When the magnetic portion was set to 2 mm in thickness, a comparatively big force was required for removing the packaging plate due to increased magnetic attraction. Therefore, it is preferable that the thickness of the magnetic layer is 1 mm or less. Moreover, when the non-magnetic layer was set to 3 mm in thickness, it sometimes occurred that the magnetic layer was strongly attracted.

What is claimed is:

1. A packaging plate for a permanent magnet-type magnetic circuit, the packaging plate comprising at least one non-magnetic layer and at least one magnetic layer;
   wherein the total thickness of the non-magnetic layer is 5 mm or more and the total thickness of the magnetic layer is 1 mm or less; and
   wherein the packaging plate has a three-layer structure of non-magnetic/magnetic/non-magnetic layers.

2. A method for packaging a permanent magnet-type magnetic circuit, comprising a step of shielding at least a portion of an aperture of a permanent magnet-type magnetic circuit using at least one packaging plate for a permanent magnet-type magnetic circuit, the packaging plate comprising at least one non-magnetic layer and at least one magnetic layer;
   wherein the permanent magnet-type magnetic circuit comprises:
   pair of permanent magnets opposing each other across a gap, the pair of permanent magnets being magnetized in a thickness direction;
   a yoke arranged outside of the gap between the permanent magnets, the yoke supporting the permanent magnets; and
   a pair of pole pieces each arranged on a gap side of an opposing surface of each of the permanent magnets and having a peripheral projection in opposing directions;
   wherein the permanent magnet-type magnetic circuit can generate a magnetic field between the pole pieces.

3. The method according to claim 2, wherein the total thickness of the non-magnetic layer is 5 mm or more and the total thickness of the magnetic layer is 1 mm or less.

4. The method according to claim 2, wherein the packaging plate has a three-layer structure of non-magnetic/magnetic/non-magnetic layers.

5. A permanent magnet-type magnetic circuit package comprising:

a permanent magnet-type magnetic circuit comprising:
   a pair of permanent magnets opposing each other across a gap, the pair of permanent magnets being magnetized in thickness direction;
   a yoke arranged outside of the gap between the permanent magnets, the yoke supporting the permanent magnets; and
   a pair of pole pieces each arranged on a gap aide of an opposing surface of each of the permanent magnets and having a peripheral projection in opposing direction;
wherein the permanent magnet-type magnetic circuit can generate a magnetic field between the pole pieces; and at least one packaging plate comprising at least one non-magnetic layer and at least one magnetic layer, said packaging plate fixed to the magnetic circuit so as to shield at least a portion of an aperture of the magnetic circuit.

6. The package according to claim 5, wherein the total thickness of the non-magnetic layer is 5 mm or more and the total thickness of the magnetic layer is 1 mm or less.

7. The package according to claim 5, wherein the packaging plate has a three-layer structure of non-magnetic/magnetic/non-magnetic layers.

\* \* \* \* \*